US 6,541,844 B2

(12) United States Patent
Miyata et al.

(10) Patent No.: US 6,541,844 B2
(45) Date of Patent: Apr. 1, 2003

(54) SEMICONDUCTOR DEVICE HAVING SUBSTRATE WITH DIE-BONDING AREA AND WIRE-BONDING AREAS

(75) Inventors: Osamu Miyata, Kyoto (JP); Ichirou Kishimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/906,436

(22) Filed: Jul. 16, 2001

(65) Prior Publication Data

US 2002/0005592 A1 Jan. 17, 2002

(30) Foreign Application Priority Data

Jul. 17, 2000 (JP) ........................................ 2000-215485
Jul. 17, 2000 (JP) ........................................ 2000-215672

(51) Int. Cl.[7] .......................................... H01L 23/495
(52) U.S. Cl. ...................... 257/666; 257/676; 257/738; 257/667; 257/737; 257/780; 257/783
(58) Field of Search ................. 257/666, 676, 257/738, 667, 737, 780, 783, 786

(56) References Cited

U.S. PATENT DOCUMENTS

| | | | | |
|---|---|---|---|---|
| 5,898,213 A | * | 4/1999 | Torres et al. | ............... 257/666 |
| 5,951,304 A | * | 9/1999 | Wildes et al. | ............... 174/261 |
| 6,232,650 B1 | * | 5/2001 | Fujisawa et al. | ............ 257/666 |
| 6,285,086 B1 | * | 9/2001 | Sota et al. | ................... 257/692 |

* cited by examiner

Primary Examiner—David L. Talbott
Assistant Examiner—Luan Thai
(74) Attorney, Agent, or Firm—Gerald T. Bodner

(57) ABSTRACT

A semiconductor device includes a substrate, and the substrate is formed with a wiring pattern on its surface. The wiring pattern includes electrodes, wire-bonding (WB) pads and connecting portions for connecting the electrodes and the WB pads. The WB pads are so formed that the lengthwise directions thereof are in parallel or approximately in parallel to lines, in radiative form, extending from the center of a die-bonding (DB) area. Accordingly, if a chip having a first size is die-bonded within the DB area, bonding wires become approximately in parallel to the lengthwise directions of the WB pads. Even if a chip having a second size smaller than the first size but the same shape is die-bonded, the bonding wires are also in parallel to the lengthwise directions of the WB pads. Thus, since one substrate can be used regardless of the size of a chip, there is no need to prepare a plurality of wiring patterns for each size of chips.

4 Claims, 12 Drawing Sheets

A/B<1.25

(A)

(B)

(C)

(D)

(A)

(B)

US 6,541,844 B2

SEMICONDUCTOR DEVICE HAVING SUBSTRATE WITH DIE-BONDING AREA AND WIRE-BONDING AREAS

BACKGROUND OF THE INVENTION

1. Field of the Invention

This invention relates to a semiconductor device and, more particularly, to a semiconductor device which comprises a substrate having a die-bonding area and being formed with a plurality of wire-bonding pads outside the die-bonding area, die-bonding a semiconductor chip onto the die-bonding area, and connecting the semiconductor chip to the wire-bonding pads by bonding wires.

2. Description of the Prior Art

A conventional semiconductor device 1 of this kind shown in FIG. 11 includes a substrate 2 formed of an insulative material such as a polyimide, glass epoxy or ceramic and etc. The substrate 2 is formed with a wiring pattern 3 of a copper (Cu) foil on the surface. An insulating film (resist) 4 is applied so as to cover the wiring pattern 3. It is noted, as shown in FIG. 12, the wiring pattern 3 includes electrodes 3a and wire-bonding pads (hereinafter referred to as "WB pad") 3b. The resist 4 is applied so as not to cover the WB pads 3b. Returning to FIG. 11, a semiconductor chip (hereinafter referred merely to as "chip") 5 is on the resist 4 and die-bonded, by a die-bonding member 6, onto a die-bonding area 2a of the substrate 2 shown in FIG. 12. It is noted in FIG. 12, the substrate 2 (die-bonding area 2a) and the wiring pattern 3 are shown partially (approximate one quarter). As shown in FIG. 11, electrical connection is made, by metal thin wires (bonding wire) 7 such as a gold wire, between electrode pads 5a provided on the chip 5 and the WB pads 3b included in the wiring pattern 3. Furthermore, the chip 5 and the bonding wires 7 are sealed by a mold resin (mold) 8 such as an epoxy resin. Then, bumps 9 as an external connecting electrode are joined to the electrodes 3a included in the wiring pattern 3 through through-holes 2a formed on the substrate 2 from a rear surface of the substrate 2. In this manner, a CSP (Chip Size Package) or BGA (Ball Grid Array) type semiconductor device has been formed.

In such a prior art, in the case of a chip 5 having a little smaller size than the die-bonding area 2a is bonded, the bonding wires 7 can be bonded onto the WB pads 3b as shown in FIG. 12. However, as shown in FIG. 13, in the case a chip 5 having a smaller size than the chip shown in FIG. 12 and the same shape is bonded, there occurs a problem that the bonding wire 7 is brought into contact with the adjacent WB pads 3b at the K portion. That is, as shown in FIG. 14, since each bonding wire 7 is provided with a smooth curved potion 7a in the vicinity contacting each WB pad 3b to absorb stress applied during bonding, the curved portion 7a is brought into contact with adjacent WB pads 3b when the bonding wire 7 traverses the adjacent WB pads 3b. That is, it causes a short-circuit.

Although forming the wiring pattern 3 according to the size of a chip would be appropriate to avoid this, there is a problem that it takes time to develop the wiring patterns 3, and thus a mounting up cost is increased.

SUMMARY OF THE INVENTION

Therefore, it is a primary object of the present invention to provide a semiconductor device capable of shortening development time period and reducing design cost.

It is another object of this invention to provide a semiconductor device capable of preventing occurrence of defective mount caused by ball fall.

A semiconductor device according to this invention comprising: a substrate having a die-bonding area and formed with a plurality of wire-bonding pads outside the die-bonding area; a semiconductor chip die-bonded onto the die-bonding area; and bonding wires connecting the semiconductor chip to the wire-bonding pads, wherein the wire-bonding pads are so formed that the lengthwise directions thereof are in parallel or approximately in parallel to lines extending from a center of the die-bonding area to bonding positions of the wire-bonding pads.

A semiconductor device according to this invention includes the substrate having flexibility such as a polyimide. The substrate has on its surface the area (die-bonding are) to die-bond the semiconductor chip (chip) thereonto. The wire-bonding pad (WB pad) to wire-bond the bonding wires is provided in plural outside the die-bonding (DB) area on the substrate. The WB pads are so formed that the lengthwise directions thereof are in parallel or approximately in parallel to the lines extending from the center of the DB area to bonding positions, i.e. radiative lines. Accordingly, if a chip having a size (the first size) little smaller than the DB area is die-bonded, the bonding wires are approximately in parallel to the lengthwise directions of the WB pads. Even if a chip having a smaller size (the second size) than the first size but the same shape is die-bonded, the bonding wires are also in parallel to the lengthwise directions of the WB pads. That is, even if chips are different in sizes, the same or similar shape permits the bonding wires to be in parallel to the lengthwise directions of the WB pads. Accordingly, a substrate (film carrier) formed with one kind of a wiring pattern can be used regardless of the size of a chip. That is, it is possible to use a film carrier commonly.

According to this invention, since a common film carrier can be used regardless of the change of the size of a chip, there is no need to develop wiring patterns for each size of chip. That is, development of only one wiring pattern can shorten development time period of a wiring pattern. Furthermore, design cost can be reduced.

In one aspect of this invention, a plurality of through-holes are formed on the substrate, and electrodes are formed at the die-bonding area on the substrate in correspondence to the through-holes. Solder balls are electrically connected (joined) to the electrodes through the through-holes. At this time, on the assumption that a diameter of each solder ball is A and a diameter of each through-holes is B, if the relation between A and B is made A/B<1.25, the force that made the solder ball in a spherical shape is never larger than the joint force between the solder ball and the electrode. Accordingly, when mounting such the semiconductor device on a printed circuit board, ball fall (phenomenon to cause the solder ball to be separated from the electrode) almost never occurs. Due to this, incidence of defective mount can be significantly reduced.

A semiconductor device according to another invention comprising: a substrate formed with through-holes; a plurality of electrodes formed inside a die-bonding area on the substrate and coupled to a plurality of wire-bonding pads formed outside the die-bonding area; and a plurality of solder balls formed on a rear surface of said substrate and connected to the electrodes through the through-holes, wherein A/B<1.25 is satisfied on assumption that a diameter of each solder ball is A and a diameter of each through-hole is B.

A semiconductor device according to another invention has the area (die-bonding area) to die-bond the chip on the substrate having flexibility such as a polyimide. The plurality of wire-bonding pads (WB pad) connected to the semiconductor chip by bonding wires are provided outside the die-bonding (DB) area. Meanwhile, the substrate has the through-holes through which the solder balls are connected to the plurality of electrodes provided from the rear surface of the substrate to the DB area and coupled to the WB pads. On the assumption that a diameter of each solder ball is A, a diameter of each through-hole is B and the relation A/B<1.25 is satisfied, the force acting on the solder ball to make it in a spherical shape is never larger than the joint force between the solder ball and the electrode. The relation of A/B<1.25 is obtained from experiments by the inventors as a condition to prevent ball fall.

According to another invention, ball fall can be prevented, significantly reducing incidence of defective mount.

In another aspect of this invention, the WB pads are so formed that the lengthwise directions thereof are in parallel or approximately in parallel to the lines extending from the center of the DB area to bonding positions, i.e. radiative lines. Accordingly, in the case a chip having a size (the first size) little smaller than the DB area is bonded, the bonding wires are approximately in parallel to the lengthwise directions of the WB pad. Even if a chip having a smaller size (the second size) than the first size but the same shape is bonded, the bonding wires are in parallel to the lengthwise directions of the WB pads. That is, even if chips are different in sizes, the same or similar shape permits the bonding wires to be in parallel to the lengthwise directions of the WB pads. Accordingly, a substrate (film carrier) formed with one kind of the wiring pattern can be used regardless of the size of a chip. That is, a film carrier can be used commonly.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
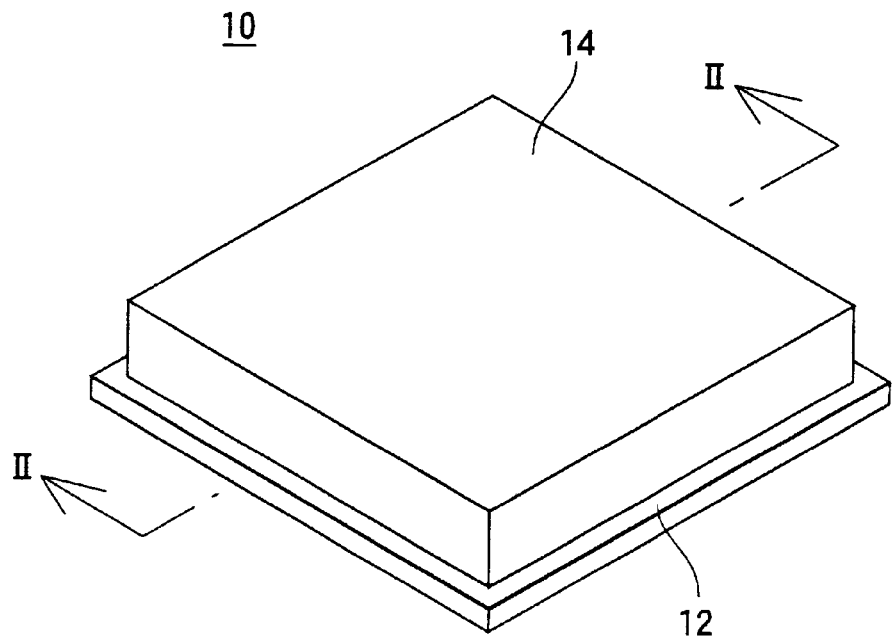
FIG. 1 is an illustrative view showing one embodiment of the present invention.

Referring to FIG. 1, a semiconductor device 10 of this embodiment is a so-called BGA type semiconductor device and includes an insulating substrate 12 (hereinafter referred merely to as "substrate") formed of a polyimide (PI) having heat resisting and flexibility. A mold 14 is formed on the substrate 12 to encapsulate or seal a chip 16, etc. to be described later. It is noted, the substrate 12 and the mold 14 is square in shape in this embodiment.

Figure 2:
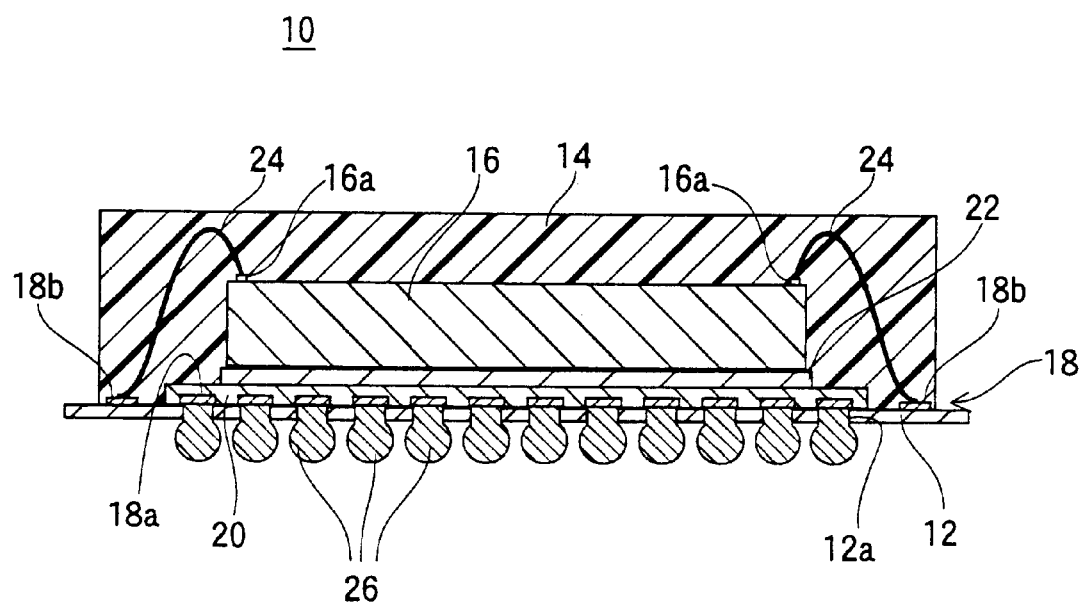
FIG. 2 is a cross-sectional view of a semiconductor device shown in FIG. 1.
Figure 3:
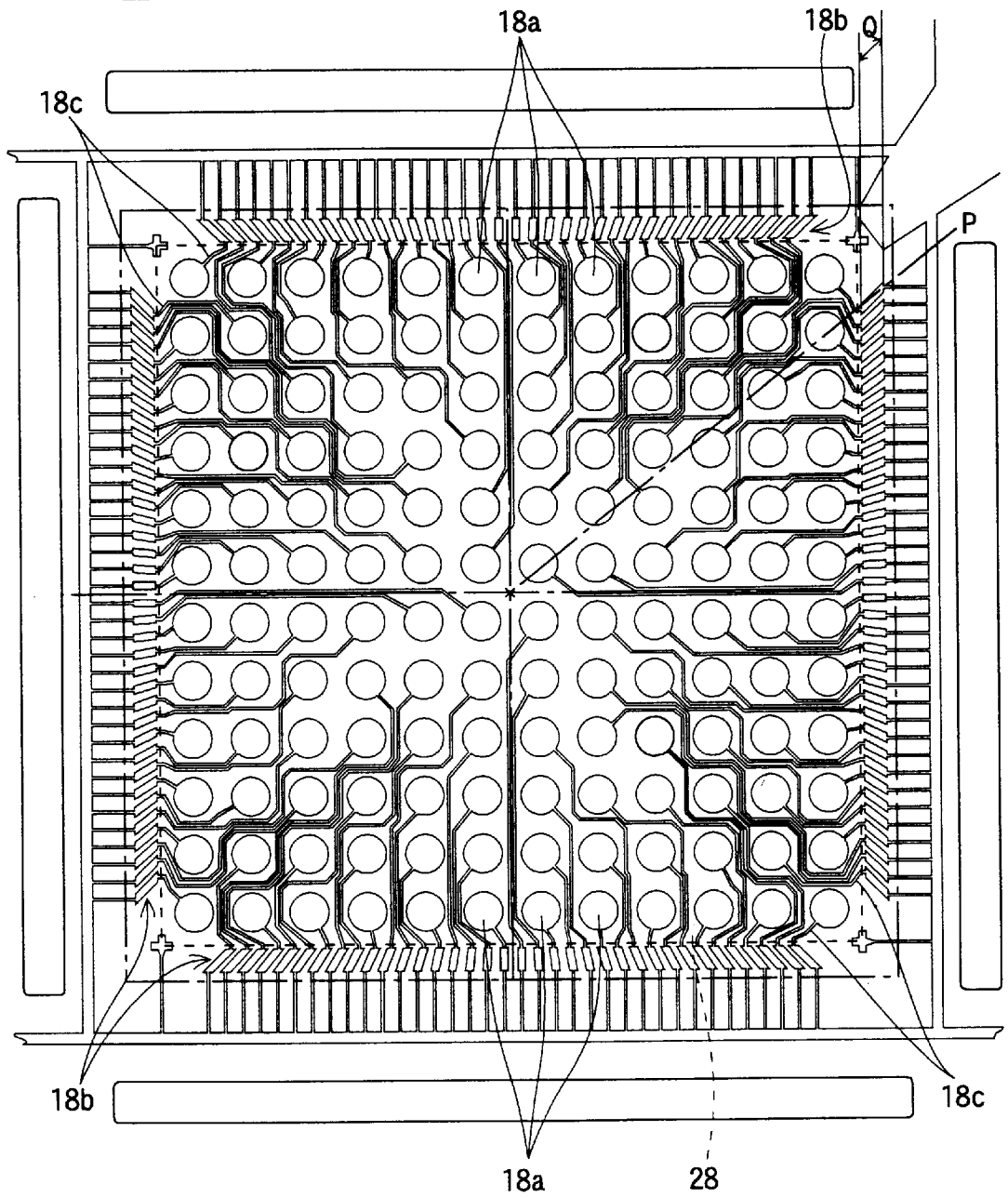
FIG. 3 is an illustrative view showing a wiring pattern of electrodes and WB pads formed on a substrate.

As can be understood from FIG. 2 showing a cross-sectional view at the line II—II in FIG. 1, through-holes 12a are formed on the substrate 12. Meanwhile, a wiring pattern 18 of a Cu foil, for example, is formed on the substrate 12. As shown in FIG. 3, the wiring pattern 18 includes electrodes 18a, wire-bonding pads (hereinafter referred to as "WB pad") 18b and connecting portions 18c for connecting the electrodes 18a to the WB pads 18b, respectively. Meanwhile, the range enclosed by one dotted line is the substrate 12.

The electrode 18a is formed in plural (12×12 (=144) in this embodiment) in a matrix form (two-dimensional array), and connected to an external connecting electrode (bump) 26 described later through the through-hole 12a, as shown in FIG. 2. That is, the through-hole 12a and the bump 26 are also formed in plural in a matrix as in the electrode 18a.

The WB pads 18b are provided in correspondence to respective ones of the electrodes 18a outside an area (die-bonding area) 28 to die-bond the chip 16 and to form a line along the circumferential periphery of the substrate 12. That is, they are formed along four sides of the substrate 12. Each WB pad 18b is approximately rectangle in shape. The WB pads 18b are so formed that the lengthwise direction Q is in parallel or approximate in parallel to the line P, in radiative form, extending from the center X of the die-bonding area 28. That is, an inclination angle of the WB pads 18b become gradually larger from the center to the ends of the array.

The connecting portions 18c connect the electrodes 18a to the WB pads 18b, and are to be patterned not to contact other electrodes 18a and WB pads 18b.

Returning to FIG. 2, an insulating film (resist) 20 is formed or applied so as to cover the wiring pattern 18 within the DB area 28 shown in FIG. 3. That is, the resist 20 is applied so as not to cover the WB pads 18b included in the wiring pattern 18. Meanwhile, the chip 16 is adhered (die-bonded) onto the resist 20 by an adhesive (die-bonding member) 22 such as a silver paste. It is noted the die-bonding member 22 may be a well-known film type adhesive formed of a polyimide resin and an epoxy resin, or the like. Electrical connection is made between a plurality of electrode pads 16a and WB pads 18b provided in the vicinity of the end of the upper surface of the chip 16 by metal thin wires 24 (bonding wire) such as a gold wire. Furthermore, the mold 14 is formed on the substrate 12, and encapsulates the chip 16 and the bonding wires 24 as described above.

Figure 4:
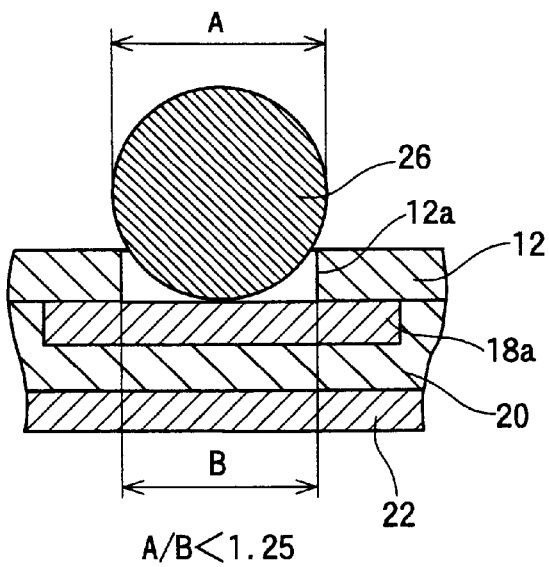
FIG. 4 is an illustrative view showing a relation between the diameter A of a solder ball and the diameter B of a throughhole.

Furthermore, direct connection is made by only a flux between the electrodes 18a formed at the DB area 28 on the substrate 12 and bumps 26, i.e. solder balls disposed in each of through-holes 12a of the substrate 12. For example, in this embodiment, as shown in FIG. 4, on the assumption that a diameter of each solder ball is A and a diameter of each through-hole 12a is B, the relation between A and B is set to satisfy A/B <1.25.

Figure 5:
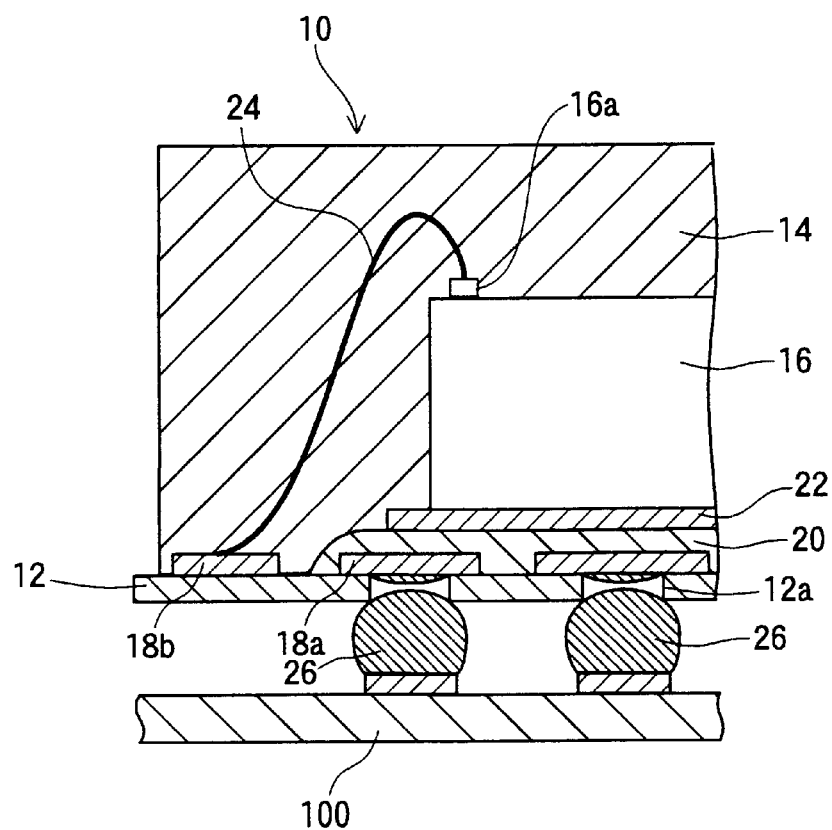
FIG. 5 is an illustrative view showing one example of occurrence of ball fall when the semiconductor device shown in FIG. 1 is mounted.

Assuming that there is no relation (restriction) and A is too large for B, a ball fall occurs when mounting the semiconductor device 10 on a printed circuit board 100 as shown in FIG. 5. Therefore, in this embodiment, these relations are so set that A is not too large for B.

Figure 6:
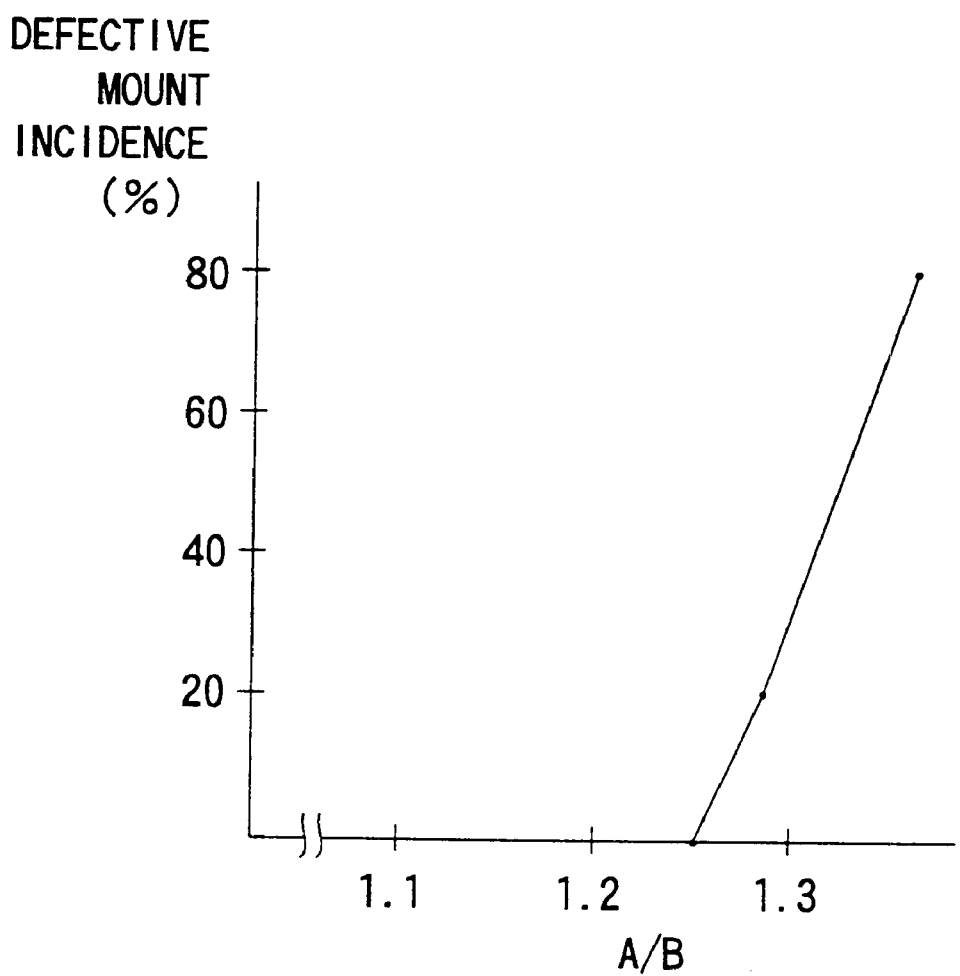
FIG. 6 is a graph showing the relation between A/B and defective mount incidence.

According to the experiments by the inventor et al. of the relation between A/B and incidence of defective mount, it is understood that the defective mount does not occur when A/B is smaller than 1.25 (A/B<1.25), as shown in the graph of FIG. 6. Accordingly, in this embodiment, the A and B are set so as to satisfy the relation of A/B<1.25.

It is noted, although the diameter A of the solder ball is not changed before and after connecting to the wiring pattern 18 (electrode 18a), the diameter A (FIG. 4) before connecting is utilized as a standard to be set to satisfy the relation A/B<1.25 in this embodiment.

Accordingly, setting properly the diameter A of a solder ball and the diameter B of a through-hole enables prevention of ball fall and decrease of an incidence of defective mount.

Figure 7:
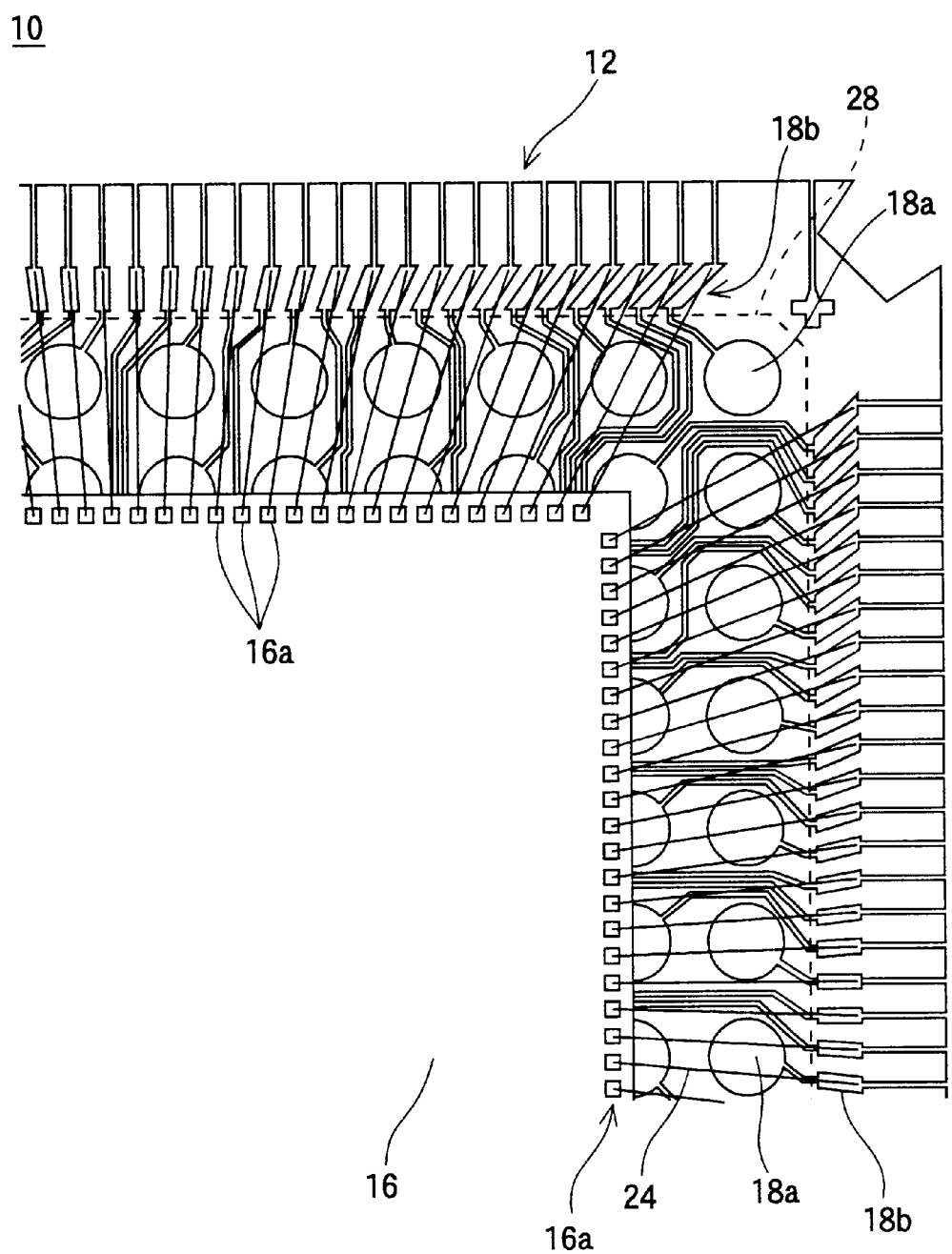
FIG. 7 is an illustrative view showing the case a chip is bonded onto the DB area shown in FIG. 3.

In the case of die-bonding the chip 16 having a size (the first size) little smaller than the DB area 28 shown in FIG. 3, the bonding wires 24 are wire-bonded as shown in FIG. 7. That is, the bonding wires 24 are wire-bonded in parallel to the line P, in radiative form, extending from the center X of the DB area 28, i.e. in parallel to the lengthwise direction Q of the WB pads 18b.

Figure 8:
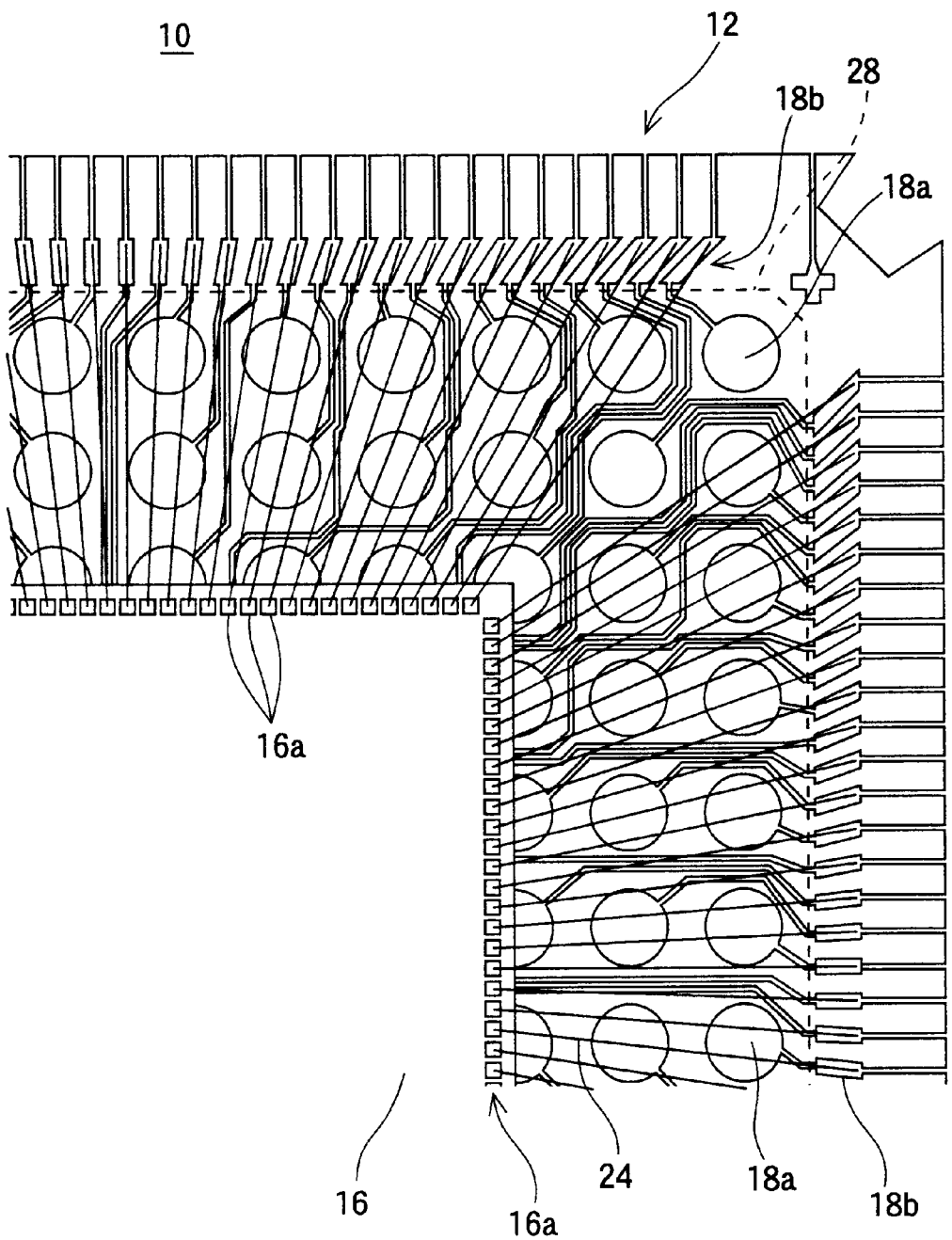
FIG. 8 is an illustrative view showing the case a chip being smaller than the chip shown in FIG. 7 is bonded onto the DB area.

It is noted the chip 16 and the DB area 28 are square in shape in this embodiment. Meanwhile, FIG. 7 is partially shown (approximate one quarter) for the purpose of ease of understanding. FIG. 8 described below is also partially shown in the same manner as in FIG. 7.

Meanwhile, as shown in FIG. 8, even if the chip 16 having the second size smaller than the first size and the same shape is die-bonded, the bonding wires 24 can be also wire-bonded in parallel to the lengthwise direction Q of the WB pads 18b.

Thus, even if the first or the second size chip is bonded, the bonding wires 24 never traverse the adjacent (different) WB pads 18b. In other words, they never contact the adjacent WB pads 18b. Accordingly, there is no need to change the wiring pattern 18 in the case of utilizing (bonding) the chip 16 of different sizes (similar shape). For this reason, it is possible to utilize the substrate 12 commonly irrespective of the chip size.

It is noted, although the invention only shows the chip 16 of the first size or the second size as shown in FIG. 7 and FIG. 8, it need not to be restricted to these sizes. That is, other sizes would be appropriate if the chip 16 is a size within the DB area 28 and the same or similar shape.

In addition, the mold 14 is omitted in FIG. 7 and FIG. 8 in order to simply explain the substrate 12, the chip 16, the wiring pattern 18, the DB area 28 and, etc.

Figure 9:
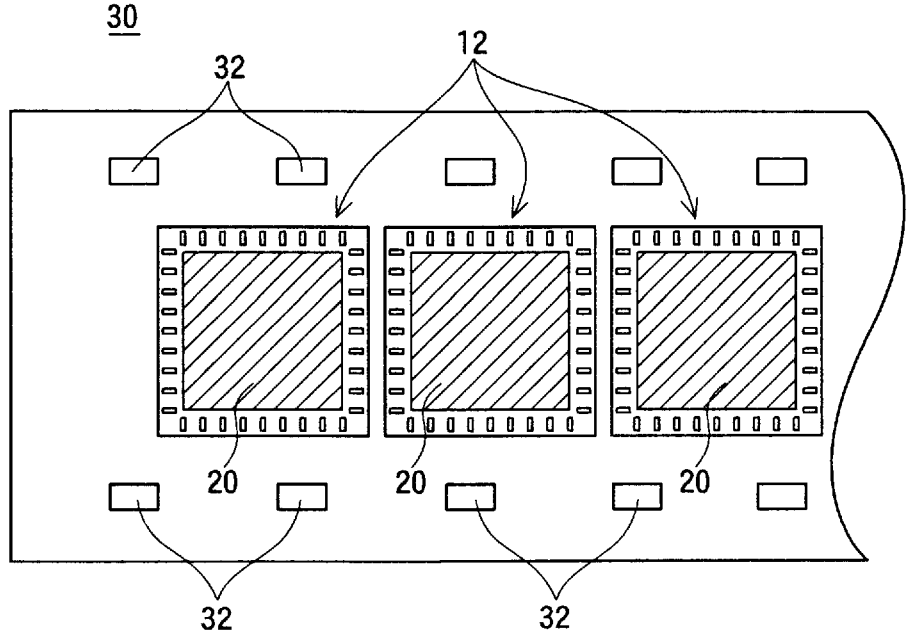
FIG. 9 is an illustrative view showing a part of a manufacturing process of the semiconductor device shown in FIG. 1.
Figure 9:
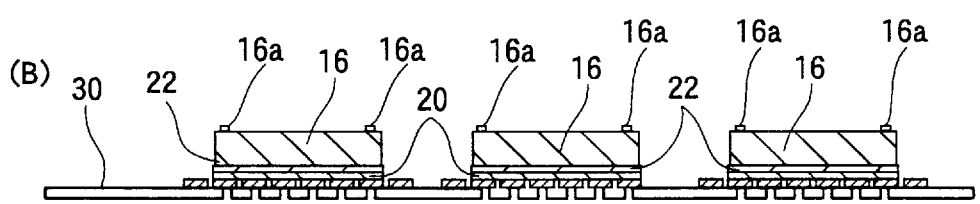
Figure 9:
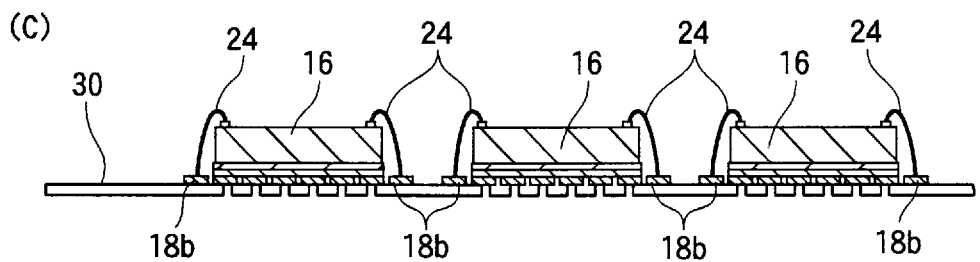
Figure 9:
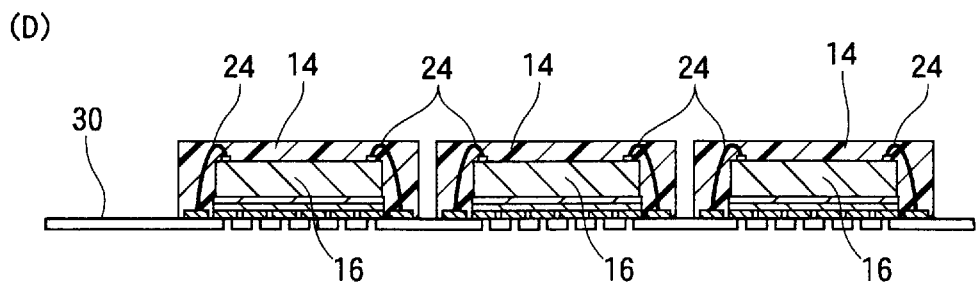

Manufacturing such semiconductor device 10, a PI tape 30 shown in FIG. 9 (A) is prepared. It is noted, in FIGS. 9 (A) to 9 (D), details of the wiring pattern 18, etc. is tersely shown for the purpose of ease of understanding.

The PI tape 30 is a film carrier formed with substrates 12 successively. The PI tape 30 has a Cu foil laminated into tape form on the surface. After being fixed by a roller (not shown), the Cu foil is etched to form the wiring pattern 18 shown in FIG. 3 successively. Furthermore, the PI tape 30 has latch holes 32 at the opposite ends. The latch holes 32 are latched by a claw provided on the carrying roller (not shown) during conveyance of the tape. Furthermore, although not shown, the PI tape 30 has, at the opposite ends, a carrier flame, such as a copper plate fixed thereunder, and is conveyed in response to the movement of the carrier flame. Accordingly, the PI tape 30 is transported while keeping a stable state, i.e. horizontal state. It is noted the carrier flame has latch holes in correspondence to the latch holes 32 of the PI tape 30.

Firstly, as shown in FIG. 9 (A), in the first step the resists 20 are applied to the PI tape 30 so as to cover the DB areas 28 for each of substrates 12. It is noted, although the resists 20 are made hatching for ease of understanding, this does not mean a cross-section. Subsequently, as shown in FIG. 9 (B), after the die-bonding members 22 are applied, the chips 16 are mounted. Accordingly, the chips 16 are die-bonded.

In the following step, as show in FIG. 9 (C), electrical connection is made, by the bonding wires 24, between the electrode pads 16a formed on the chips 16 and the WB pads 18b. That is, the chips 16 are wire-bonded. Then, a metal mold (not shown) is applied and a mold resin is flown into it. After the resin is stiffened, the metal mold is released. In this manner, the mold resin is casted and the molds 14 are formed as shown in FIG. 9 (D).

Figure 10:
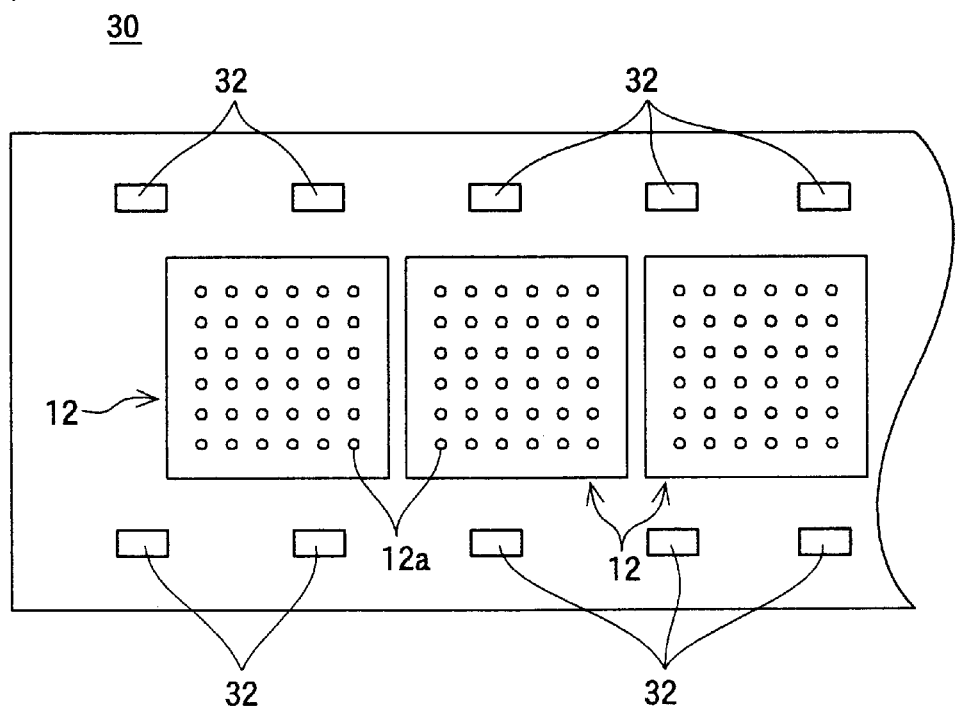
FIG. 10 is an illustrative view showing another part of the manufacturing process of the semiconductor device shown in FIG. 1.
Figure 10:
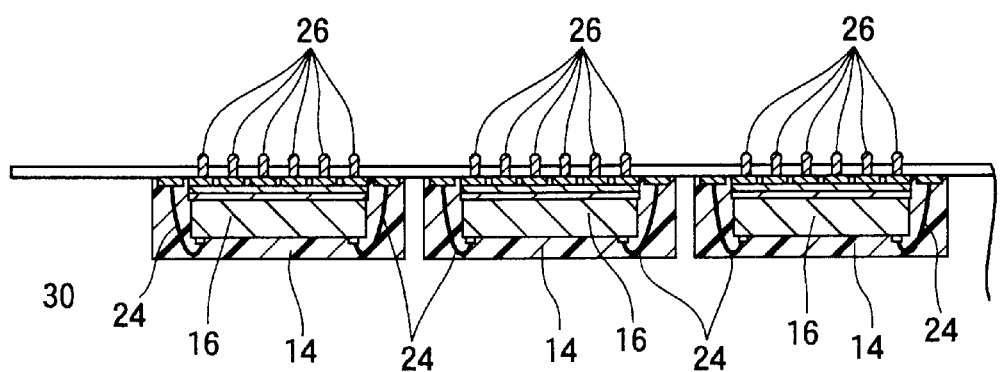
Figure 11:
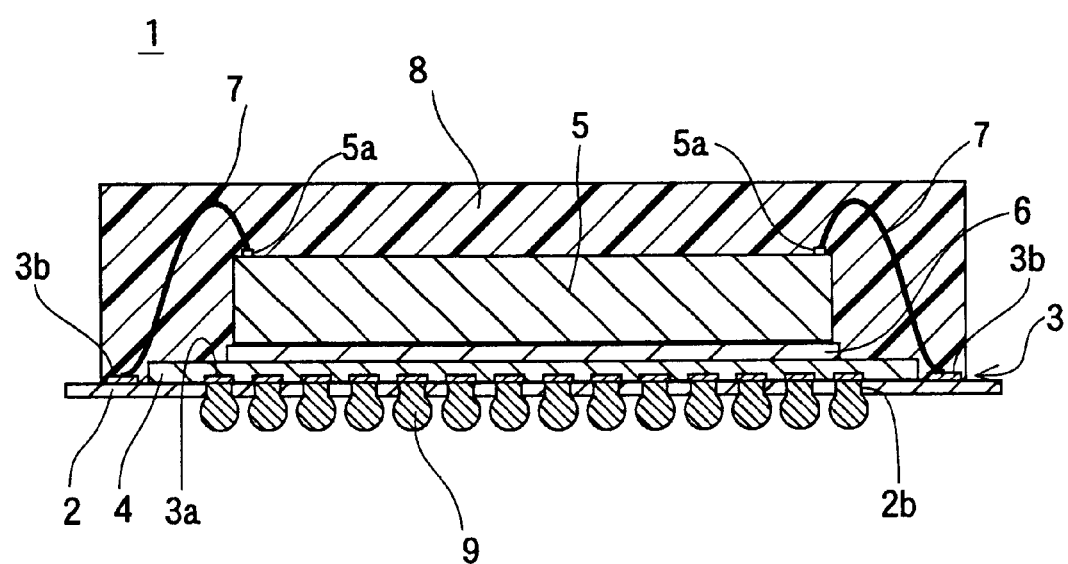
FIG. 11 is an illustrative view showing a conventional semiconductor device.
Figure 12:
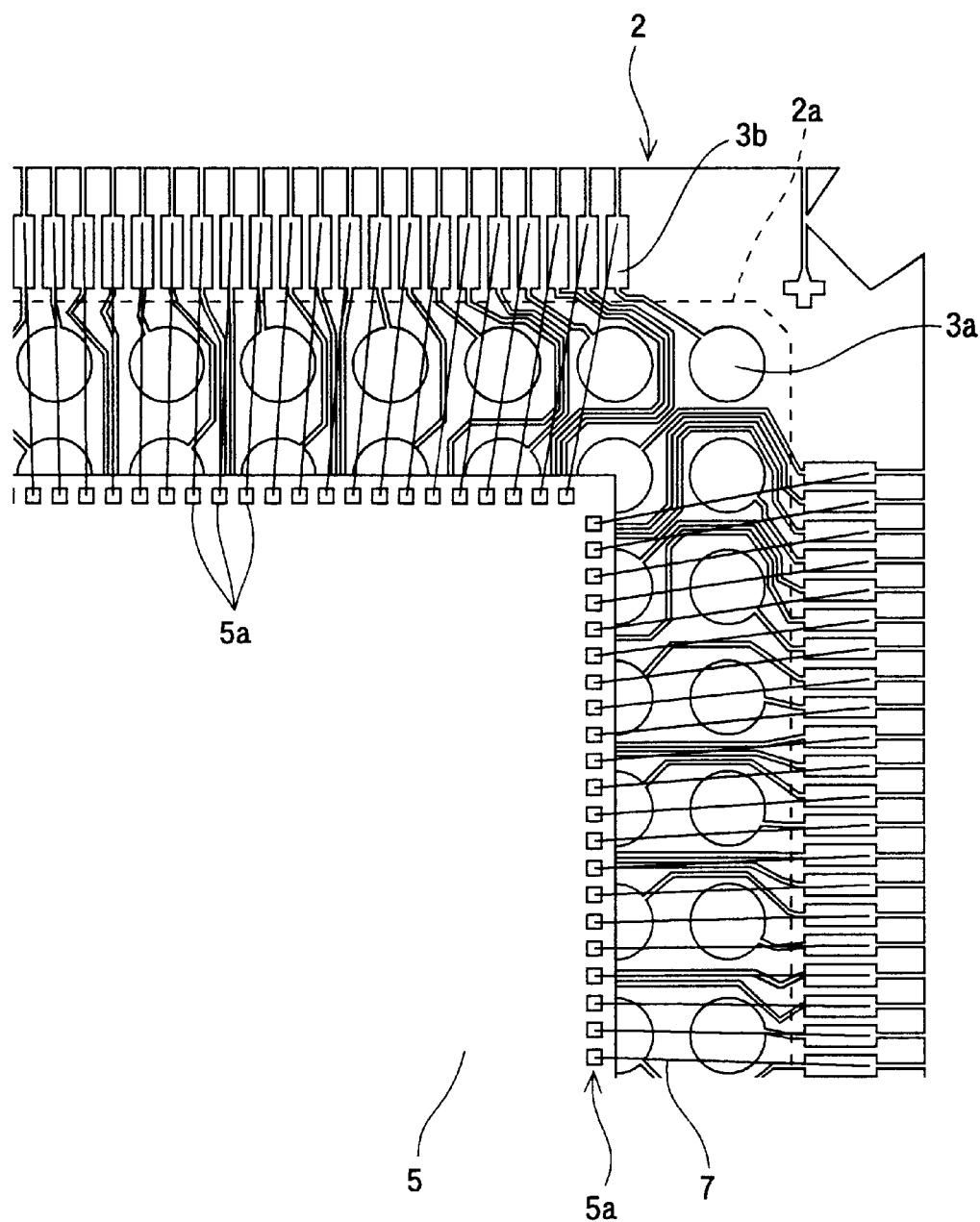
FIG. 12 is an illustrative view showing the case a chip is bonded onto the DB area on the substrate included in the semiconductor device shown in FIG. 11.
Figure 13:
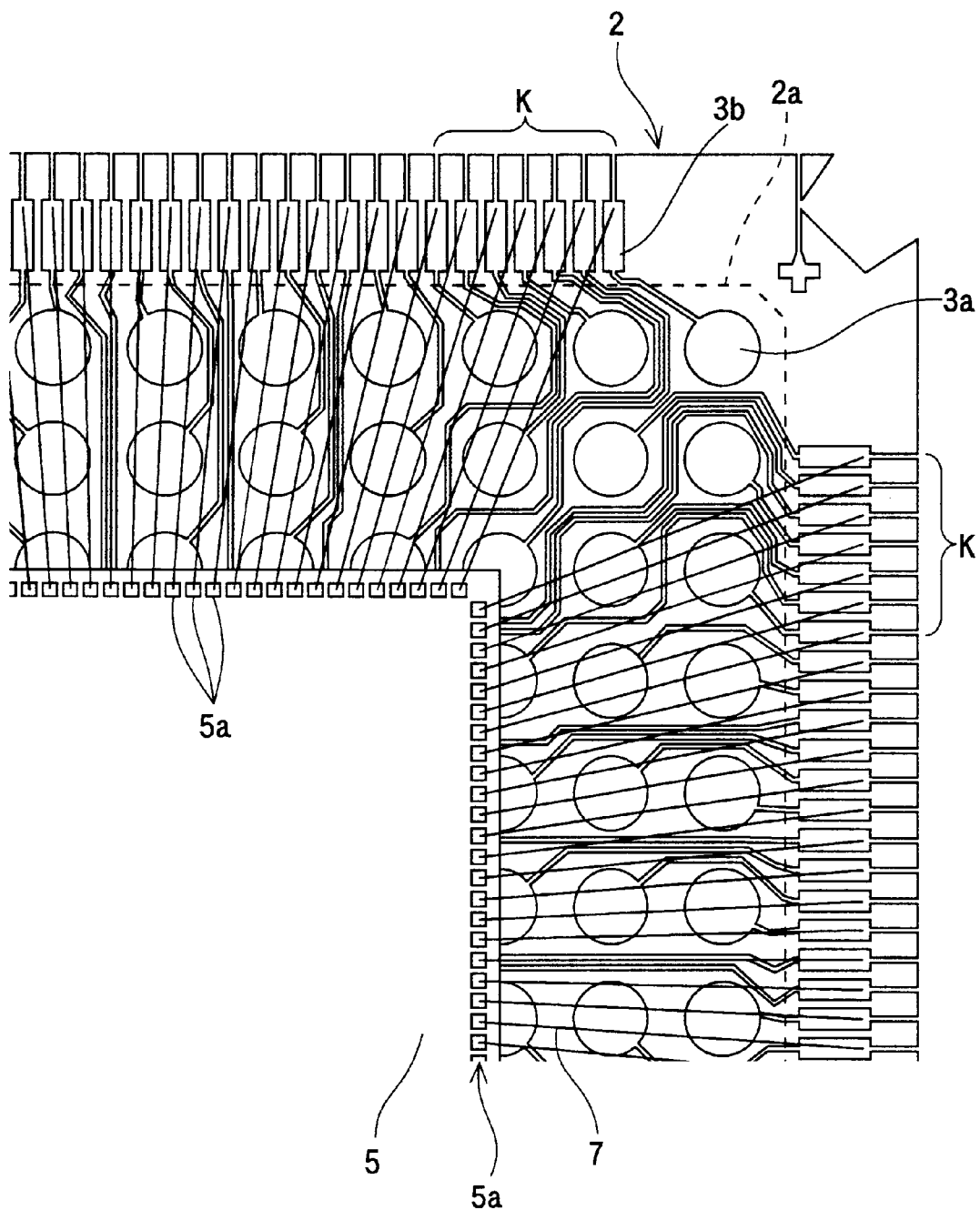
FIG. 13 is an illustrative view showing the case a chip being smaller than the chip shown in FIG. 12 is bonded onto the DB area on the substrate included in the semiconductor device shown in FIG. 11.
Figure 14:
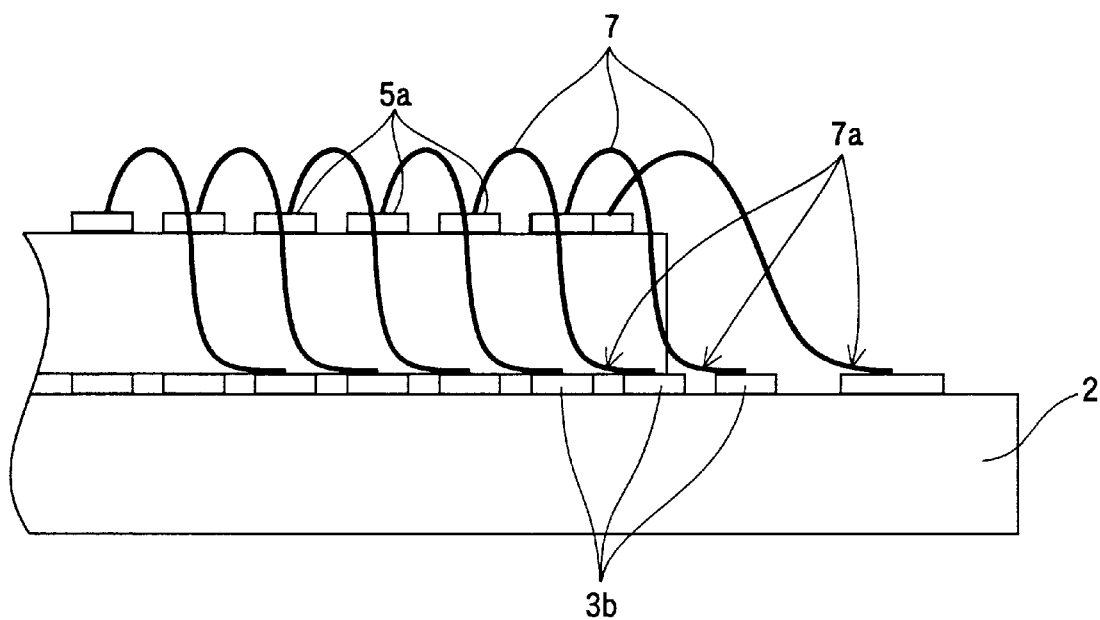
FIG. 14 is an illustrative view showing the relation between WB pads and bonding wires provided on the substrate in the case the chip shown in FIG. 13 is die-bonded.

Furthermore, in the following step, as shown in FIG. 10 (A), the PI tape (30) is deposed in reverse to FIG. 9 (A), i.e. the chips 16 are deposed on the underside of the substrates 12. After a flux is applied to the rear surface of the substrates 12 (surface not formed with wiring pattern), solder balls are transferred to respective ones of the throughholes 12a. Subsequently, a reflow process is made and each solder ball is melted and joined to the corresponding electrode 18a through the throughole 12a. Accordingly, the bumps 26, as shown in FIG. 10 (B), are formed. Thereafter, each semiconductor device 10 is cut (punch) from the PI tape 30 at the one dotted line shown in FIG. 3, thereby successively manufacturing (form) a plurality of semiconductor devices 10.

According to this invention, since a substrate (PI tape) can be used commonly regardless of the change of the size of a chip, there is no need to develop a plurality of wiring patterns for each size of chip. For this reason, it is possible to shorten time to develop a wiring pattern. Furthermore, design cost can be reduced.

Meanwhile, since the diameter A of the solder ball (bump) and the diameter B of the throughole are set to satisfy the relation A/B<1.25, ball fall can be prevented when mounting the completed semiconductor device. For this reason, occurrence of defective mount can be significantly reduced.

Furthermore, since a substrate is formed of a material having flexibility such as a polyimide, stress applied to the semiconductor body can be absorbed. Accordingly, occurrence of crack in the semiconductor device can be prevented.

It is noted in this embodiment, one kind of the wiring pattern is designed and shared with all of the chips having different sizes. However, in the case the number of pins of the chip for use (the number of the electrode pad 16a) is different, particularly in the case the number of pins increases, there is a need to change a wiring pattern. Accordingly, it would be appropriate the kinds of the wiring patterns are selectable according to the number of pins of the chip for use, preparing several kinds of wiring patterns according to the number of the pins of the chip for use.

Meanwhile, in this embodiment although a substrate is formed of a polyimide, a substrate can be formed of other insulating materials such as a glass epoxy and a ceramic. However, a glass epoxy would make a substrate thick. Meanwhile, although a ceramic is relatively thin and light in weight, it mounts up of cost. Accordingly, it would be most appropriate a substrate is formed of a polyimide which is relatively thin and low price, and has flexibility and heat resisting.

Furthermore, in this embodiment, although explanation is only made as to a chip of square shape in the case of utilizing a square substrate, use of a chip of rectangle shape in the case of utilizing a rectangle substrate leads the same effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a substrate having a die-bonding area and formed with a plurality of wire-bonding pads outside said die-bonding area and having through-holes;

a semiconductor chip die-bonded onto said die-bonding area;

solder balls connected to electrodes formed within said die-bonding area and coupled to said wire-bonding pads through said through-holes; and bonding wires connecting said semiconductor chip to said wire-bonding pads, wherein said wire-bonding pads are so formed that the lengthwise directions thereof are in parallel or approximately in parallel to lines extending from a center of said die-bonding area to bonding positions of said wire-bonding pads, respectively; and $A/B<1.25$ is satisfied on assumption that a diameter of each solder ball is A and a diameter of each through-hole is B.

2. A semiconductor device according to claim 1, wherein said substrate includes a flexible film.

3. A semiconductor device, comprising:

a substrate formed with through-holes;

a plurality of electrodes formed inside a die-bonding area on said substrate and coupled to a plurality of wire-bonding pads formed outside said die-bonding area, wherein said wire-bonding pads are so formed that the lengthwise directions thereof are in parallel or approximately in parallel to lines extending from a center of said die-bonding area to bonding positions of wire-bonding pads, respectively;

a plurality of solder balls formed on a rear surface of said substrate and connected to said electrodes through said through-holes, wherein $A/B<1.25$ is satisfied on assumption that a diameter of each solder ball is A and a diameter of each through-hole is B.

4. A semiconductor device according to claim 3, wherein said substrate includes a flexible film.

* * * * *